United States Patent
Cook

(10) Patent No.: US 10,923,313 B1
(45) Date of Patent: Feb. 16, 2021

(54) CHARGED PARTICLE BEAM DEVICE AND METHOD OF OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventor: Benjamin John Cook, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/655,976

(22) Filed: Oct. 17, 2019

(51) Int. Cl.
| | | |
|---|---|---|
| *H01J 37/153* | (2006.01) | |
| *H01J 37/09* | (2006.01) | |
| *H01J 37/147* | (2006.01) | |
| *H01J 37/10* | (2006.01) | |

(52) U.S. Cl.
CPC ............ *H01J 37/153* (2013.01); *H01J 37/09* (2013.01); *H01J 37/10* (2013.01); *H01J 37/1474* (2013.01); *H01J 2237/0453* (2013.01); *H01J 2237/1534* (2013.01)

(58) Field of Classification Search
CPC .......... H01J 37/153; H01J 37/09; H01J 37/10; H01J 37/1474; H01J 2237/0453; H01J 2237/1534
See application file for complete search history.

(56) References Cited

U.S. PATENT DOCUMENTS

2006/0289804 A1* 12/2006 Knippelmeyer .... H01J 37/3177
250/492.22
2013/0248731 A1 9/2013 Tanimoto et al.

FOREIGN PATENT DOCUMENTS

| WO | 2005/024881 A2 | 3/2005 |
| WO | 2007/028596 A1 | 3/2007 |

OTHER PUBLICATIONS

International Search Report and Written Opinion for Application No. PCT/EP2020/075388, dated Dec. 2, 2020, 16 pages.

* cited by examiner

*Primary Examiner* — Nicole M Ippolito
*Assistant Examiner* — Hanway Chang
(74) *Attorney, Agent, or Firm* — Kilpatrick Townsend & Stockton LLP

(57) ABSTRACT

The charged particle beam device includes a charged particle source and a beamlet-forming multiaperture plate. The device also includes a precompensator for reducing aberrations of the beamlets at a target, a scanner for scanning each of the beamlets, an objective lens for focusing each beamlet onto the target, and a controller configured to synchronize the precompensator and the scanner. The precompensator includes: at least one "radially variable" multiaperture electrode in which the diameter of each aperture thereof scales with the distance of the aperture from the optical axis, z; and at least one "cartesianally variable" multiaperture electrode in which the diameter of each aperture thereof scales with an x component of the position of the aperture.

22 Claims, 5 Drawing Sheets

FIG. 5
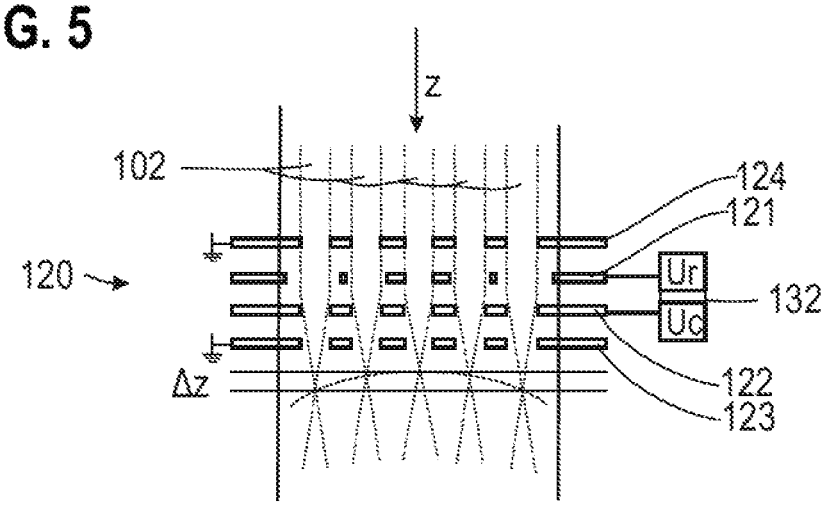
FIG. 6
FIG. 7
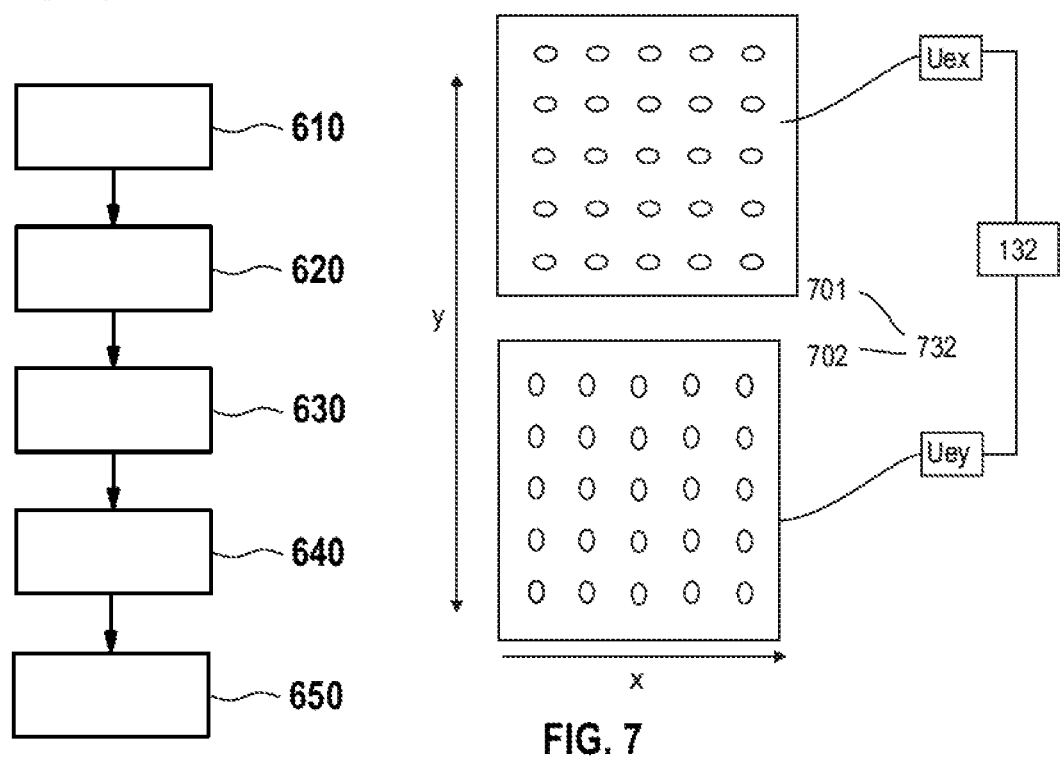

CHARGED PARTICLE BEAM DEVICE AND METHOD OF OPERATING A CHARGED PARTICLE BEAM DEVICE

TECHNICAL FIELD

Embodiments described herein relate to charged particle beam devices, such as scanning electron microscopes which can be configured to inspect specimens such as wafers or other substrates, e.g. to detect pattern defects. More specifically, Embodiments described herein relate to charged particle beam devices configured to utilize multiple charged particle beams, e.g. a plurality of beamlets. Charged particle beamlets can be used for inspection and/or testing at high resolution, lithography, and surface imaging. Embodiments described herein further relate to correction of aberrations, such as field curvature, and to methods of operating charged particle beam devices.

BACKGROUND

Modern semiconductor technology has created a high demand for structuring and probing specimens at high resolution, reaching nanometer or even sub-nanometer resolution. Micrometer and nanometer scale process control, inspection, and structuring is often done with charged particle beams, e.g. electron beams, which are generated, shaped, deflected, and focused in charged particle beam devices, such as electron microscopes. Charged particle beams can offer fine spatial resolution.

Devices using charged particle beams such as scanning electron microscopes (SEM) have many applications, especially in integrated circuit technology. In charged particle beam systems, fine probes with variable current density, such as high current density, can be used. For instance, in the case of an SEM, a primary electron beam can generate signal charged particles like secondary electrons (SE) and/or backscattered electrons (BSE) that can be used to image and analyze a specimen.

The use of multiple beams (referred to herein as beamlets) in a single column may be useful in many applications. Directing, scanning, deflecting, shaping, correcting, and/or focusing individual beamlets of a multi-beam system can be, challenging, for example when sample structures are to be scanned and inspected quickly with high throughput with nanoscale resolution.

Correcting aberrations, such as a field curvature, of multiple beams in a single column can also be challenging. It is desirable to reduce aberrations.

Accordingly, it would be beneficial to provide charged particle beam devices configured as multi-beam systems which provide a high throughput and good field qualities to be used for inspecting sample structures. In particular, it would be beneficial to provide a charged particle beam device configured for multi-beam operation with reduced aberrations.

SUMMARY

Herein are disclosed charged particle beam devices and methods of operating charged particle beam devices. Further aspects, advantages, and features of the embodiments are apparent from the dependent claims, the description, and the accompanying drawings.

Herein is disclosed a charged particle beam device. The charged particle beam device includes a charged particle source and a beamlet-forming multiaperture plate centered on an optical axis, z. The beamlet-forming multiaperture plate includes a plurality of apertures, each aperture for passing a beamlet, the beamlet-forming multiaperture plate forming a plurality of beamlets of charged particles. The device also includes a precompensator for reducing aberrations of the beamlets at a target, a scanner for scanning each of the beamlets, an objective lens for focusing each beamlet onto the target, and a controller configured to communicate with the precompensator and the scanner. The precompensator includes: at least one "radially variable" multiaperture electrode in which the diameter of each aperture thereof scales with the distance of the aperture from the optical axis, z; and at least one "cartesianally variable" multiaperture electrode in which the diameter of each aperture thereof scales with an x component of the position of the aperture, x being perpendicular to z.

Herein is disclosed a method of operating a charged particle beam device, comprising forming a beam of charged particles and forming a plurality of beamlets from the beam of charged particles. The beamlets are centered on an optical axis, z, of the device, such that a majority of the plurality of the beamlets, after passing a beamlet-forming multiaperture plate, are shifted from the optical axis. The method also includes precompensating each of the beamlets by passing each beamlet through a precompensator which reduces aberrations of the beamlets at a target. The precompensator comprises a plurality of multiaperture electrodes, including at least one "radially variable" multiaperture electrode in which the diameter of each aperture thereof scales with the distance of the aperture from the optical axis, z; and at least one "cartesianally variable" multiaperture electrode in which the diameter of each aperture thereof scales with an x component of the position of the aperture, x being perpendicular to z. The method also includes scanning each of the beamlets along a direction perpendicular to z; and focusing each of the beamlets with an objective lens onto the target to form a plurality of focal points.

Herein is disclosed a precompensator for a charged particle device, comprising at least one "radially variable" multiaperture electrode in which the diameter of each aperture thereof scales with the distance of the aperture from the optical axis, z; and at least one "cartesianally variable" multiaperture electrode in which the diameter of each aperture thereof scales with an x component of the position of the aperture, x being perpendicular to z.

It is convenient to consider the aberrations as being decomposable into a radially dependent portion and a cartesianally dependent portion. The precompensator as described herein exploits such decompositions of aberration. Furthermore, it is convenient to regard that each of the radial and cartesian portions of the aberrations can be further decomposed into contributions which scale according to a coordinate such as x, y, or r (radial distance from the optical axis). The scalings can be according to portions, or terms, of varying order (M=1, 2, 3 . . . and N=1, 2, 3 . . . for the radial and cartesian portions, respectively).

Embodiments disclosed herein are directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

A more particular description of embodiments, briefly summarized above, may be had by reference to further embodiments. The accompanying drawings relate to one or more embodiments and are described in the following.

FIG. 5 is a schematic sectional view of a precompensator according to embodiments described herein;

FIG. 6 is a flow diagram illustrating a method of operating a charged particle beam device according to embodiments described herein; and FIG. 7 illustrates a multiaperture electrode, according to embodiments described herein.

DETAILED DESCRIPTION

Figure 1:
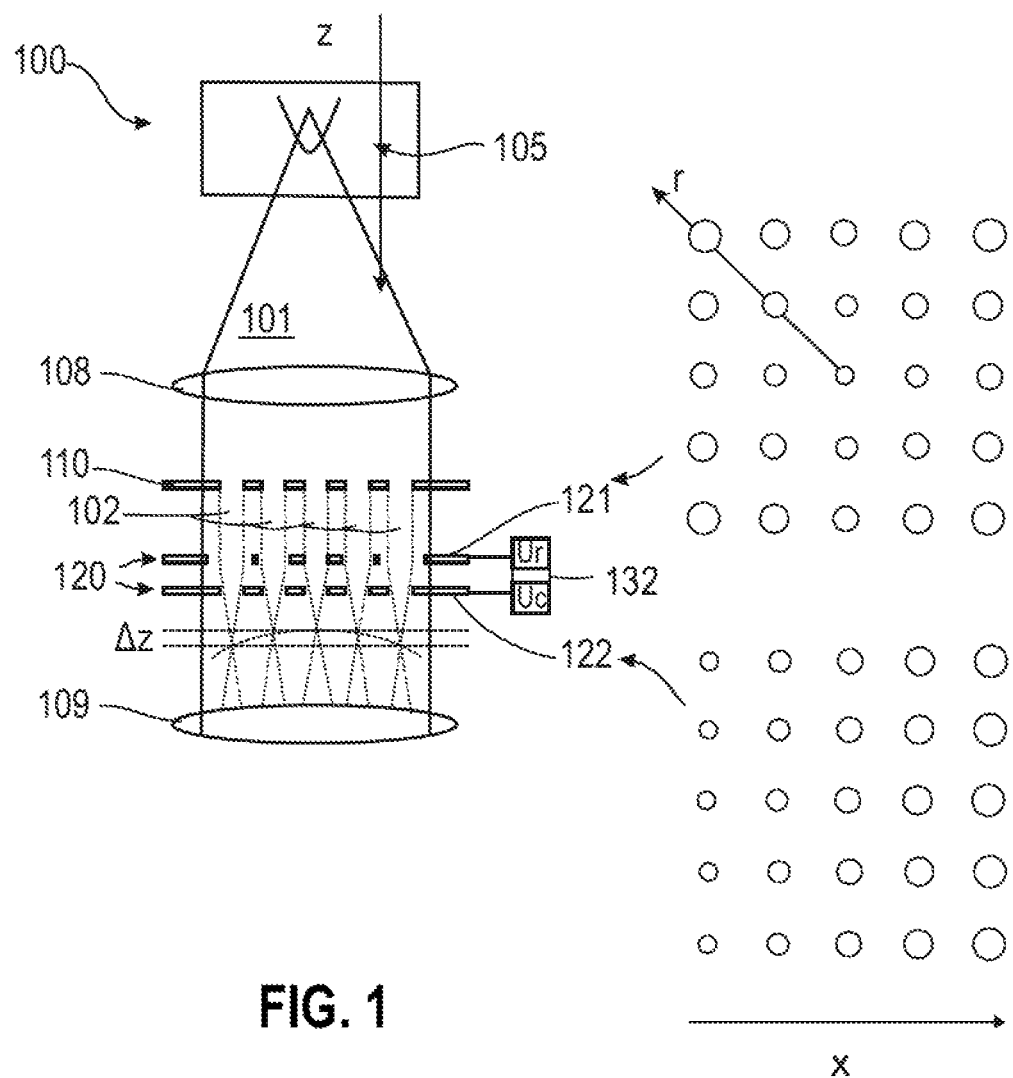
FIG. 1 is a schematic sectional view of a charged particle beam device according to embodiments described herein.

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Semiconductor technology is dependent on an accurate control of the various processes used during the production of integrated circuits. For example, substrates such as wafers and masks have to be inspected repeatedly, in order to localize problems or defects. A mask or reticle has to be inspected before actual use during substrate processing, in order to make sure that the mask accurately defines a predetermined pattern. The inspection of a specimen such as substrates, wafers or masks for defects typically includes the examination of a large surface area in a comparably short time. A high inspection speed can be desirable, in order to avoid a reduction of the production throughput by the inspection process.

The surface of a target, such as a specimen, can be scanned using a charged particle beam, e.g. an electron beam, which may be focused on the surface of the specimen. When the charged particle beam hits the target, secondary charged particles (e.g., secondary electrons) are generated and detected. A pattern defect at a location of the target can be detected by comparing an intensity signal of the secondary charged particles to, e.g., a reference signal corresponding to the same location of the target. When only one charged particle beam is used for scanning, scanning may take a considerable amount of time, and only a limited throughput may be obtainable.

The throughput may be increased by providing a charged particle beam device configured as a multi-beam system. In a multi-beam system, a plurality of beamlets of charged particles are generated which propagate next to each other in a column so that two or more spots on the target can be inspected simultaneously. However, controlling, shaping and correcting a plurality of beamlets can be challenging.

Herein, the coordinates and/or directions x, y, and z are perpendicular to each other, with z corresponding to the optical axis of the device.

Herein "optional" features and steps may be combined with any embodiment of the charged particle device and/or methods of operation thereof, which are disclosed herein. Optional feature may be combined with each other. For example, optional components and/or configurations of components of the precompensator can be combined.

Herein, to imply or say that each diameter of a plurality of apertures of a multiaperture electrode "scales with," "increases with," and/or "decreases with" a parameter (such as r, x, and/or y) can mean that each diameter has an offset value such that each aperture of the plurality has a positive diameter. Similarly, the ratio Q of the major/minor axes of a plurality of apertures of a multiaperture electrode which "scales with," "increases with," and/or "decreases with" a parameter (such as r, x, and/or y) can mean that each ratio Q has an offset value such that each aperture of the plurality ratio Q.

FIG. 1 is a schematic sectional view of a charged particle beam device 100, according to embodiments described herein.

The charged particle beam device 100 includes a charged particle source 105 configured to generate a charged particle beam 101 propagating along an optical axis, z. The charged particle source 105 may be an electron source configured to generate an electron beam. Alternatively, the charged particle source may be an ion source configured to generate an ion beam. The charged particle beam 101 may propagate from the charged particle source 105 toward a target through a column along an optical axis, z.

In some embodiments, the charged particle source 105 may include at least one of a cold field emitter (CFE), a Schottky emitter, a thermal field emitter (TFE) or another high current electron beam source, in order to increase the throughput. A high current is considered to be 10 pA in 100 mrad or more, for example up to 5 mA, e.g. 30 pA in 100 mrad to 1 mA in 100 mrad. According to typical implementations, the current is distributed essentially uniformly, e.g. with a deviation of +/−10%. According to some embodiments, which can be combined with other embodiments described herein, the charged particle source can have a typical emission half angle of 5 mrad or above, e.g. 50 mrad to 200 mrad. In some embodiments, the charged particle source may have a virtual source size of 2 nm or more and/or 60 nm or less. For example, if the charged particle source is a Schottky emitter, the source may have a virtual source size from 10 nm to 60 nm. For example, if the charged particle source is a cold field emitter (CFE), the source may have a virtual source size from 2 nm to 20 nm.

According to embodiments, which can be combined with other embodiments described herein, a TFE or another high reduced-brightness source capable of providing a large beam current is a source where the brightness does not fall by more than 20% of the maximum value when the emission angle is increased to provide a maximum of 10 pA-100 µA. For example, Schottky or TFE emitters are currently available with a measured reduced-brightness of $5 \cdot 10^7$ $Am^{-2}(SR)^{-1}V^{-1}$, and CFE emitters have a measured reduced-brightness of up to $5 \cdot 10^9$ $Am^{-2}(SR)^{-1}V^{-1}$. For example, a beam which has at least $5 \cdot 10^7$ $Am^{-2}(SR)^{-1}V^{-1}$ is beneficial.

A plurality of optical elements may be arranged along the beam path between the charged particle source and the target. For example, a collimating lens 108 may be arranged downstream of the charged particle source 105 for collimating the charged particle beam 101.

The charged particle beam device 100 may include a beamlet-forming multiaperture plate 110 with a plurality of apertures configured to create a plurality of beamlets 102 of charged particles from the charged particle beam 101. For example, the beamlet-forming multiaperture plate 110 may have three, five, ten or more apertures configured to create three, five, ten or more beamlets. In particular, the beamlet-forming multiaperture plate 110 may have fifty or more apertures for generating fifty or more beamlets. Each of the apertures of the beamlet-forming multiaperture plate 110 may be configured to create one beamlet of charged particles from the charged particle beam.

The beamlet-forming multiaperture plate 110 may include a plate in which the apertures are formed as beam limiting holes. When the charged particle beam 101 impinges on the plate having the apertures formed therein, charged particles can propagate through the apertures in the plate to form the plurality of beamlets, and a remaining part of the charged particle beam 101 may be blocked by the plate. In some embodiments, at least one surface of the beamlet-forming multiaperture plate 110, e.g. the surface of the beamlet-forming multiaperture plate 110 directed toward the charged particle source 105, may be a conductor or semiconductor surface in order to reduce or avoid an accumulation of charges. The beamlet-forming multiaperture plate 110 can be centered on the optical axis, z.

It is noted that the multiaperture plate 110 is shown in FIG. 1 to be upstream of a precompensator 120. It is also possible that the plurality of beamlets 102 may be formed from the charged particle beam 101 by a multiaperture plate of the precompensator 120. In other words, the beamlet-forming multiaperture plate and the precompensator may be integrally formed in some embodiments.

According to embodiments described herein, the charged particle beam device 100 includes a precompensator 120. The precompensator 120 reduces aberrations, such as those due to field curvature, of the beamlets. It is desirable to reduce aberrations at a target.

The precompensator can include a plurality of multiaperture electrodes, which may be centered on the optical axis. Each multiaperture electrode may be a plate with a plurality of apertures, with the electric potential of at least a portion of the plate being adjustable. The plate may include a conductive layer or film which can be addressed by a voltage source and/or controller 132. Each of the multiaperture electrodes of the device 100 may be provided as a plate element in which a plurality of apertures are provided through which the plurality of beamlets can propagate.

The precompensator 120 can include at least one "radially variable" multiaperture electrode 121, which may be centered on the optical axis. The precompensator 120 can include at least one "cartesianally variable" multiaperture electrode 122, which may be centered on the optical axis.

The multiaperture electrodes 121, 122 of the precompensator 120 each have a plurality of openings for the plurality of beamlets. The plurality of openings of each multiaperture electrode 121, 122 of the precompensator 120 may be aligned with each other, and with the apertures of the beamlet-forming multiaperture plate 110, e.g. such that the plurality of beamlets propagate through respective apertures of each multiaperture plate 121, 122 and the beamlet-forming multiaperture plate 110.

According to embodiments described herein, the "radially variable" multiaperture electrode(s) 121 can provide a focusing effect on the plurality of beamlets 102. The strength of the focusing effect on each beamlet can depend on the distance of the respective beamlet from the optical axis, z. The focusing effect can also depend on a voltage(s) applied to the "radially variable" multiaperture electrode(s). The focusing effect provided by the "radially variable" multiaperture electrode(s) 121 on a beamlet can vary with the distance from the optical axis, z, such that a beamlet which is distant from the optical axis is focused differently from a beamlet that is close to the optical axis.

In an embodiment, the focusing effect of each multiaperture electrode of the precompensator 120 may be influenced/controlled by a respective voltage applied to the respective multiaperture electrode, such as from the controller 132.

For example, the diameter of each aperture of each "radially variable" multiaperture electrode 121 scales with the distance of the aperture from the optical axis, z. With reference to FIG. 1, the distance from the optical axis, z, can be along the radial direction, r.

The diameters of apertures of the "radially variable" multiaperture electrode 121 can increase with an increasing radial distance, r, from the optical axis, z, as is illustrated in FIG. 1. Alternatively/additionally, the diameters of apertures of the "radially variable" multiaperture electrode can decrease with an increasing radial distance, r, from the optical axis, z. The precompensator 120 can have, for example, a "radially variable" multiaperture electrode in which the aperture diameters thereof increase with the distance from the optical axis, z, and another "radially variable" multiaperture electrode in which the aperture diameters decrease with the distance from the optical axis.

The "cartesianally variable" multiaperture electrode(s) 122 of the precompensator 120 can be understood similarly, in comparison to the "radially variable" multiaperture electrode(s) 121. The diameter of each aperture of the "cartesianally variable" multiaperture electrode(s) 122 can scale with an x component of the position of the aperture (x being perpendicular to z).

As described herein, the multiaperture electrodes 121, 122 of the precompensator 120 can be used to reduce aberrations of the beamlets 102, such as aberrations of the beamlets which would normally be present at the target 103, particularly those due to field curvature. The precompensation can be tuned and/or adjusted by operation of the device as described in more detail herein. It can be beneficial to provide a precompensator 120 that can be adjusted such that an appropriate amount of aberration correction is provided on the beamlets, which may depend on the position and/or path of the beamlet through the device. It is particularly contemplated that the precompensator 120 can dynamically precompensate aberrations which arise dynamically, such as during scanning of the beamlets. This can be useful in correcting for varying aberrations which may depend on the optical path of the beamlets, which may change during operation of the device 100.

It is useful to consider, as an example, field curvature aberrations. Beamlets 102 can be subjected to aberration in the form of field curvature, which can result in a shift of focus, $\Delta z$, along the z direction which scales with the radial distance, r, of the beamlet from the optical axis z. The source of optical aberration is not necessarily limited to field curvature. Other sources of aberration may be present.

Figure 2:
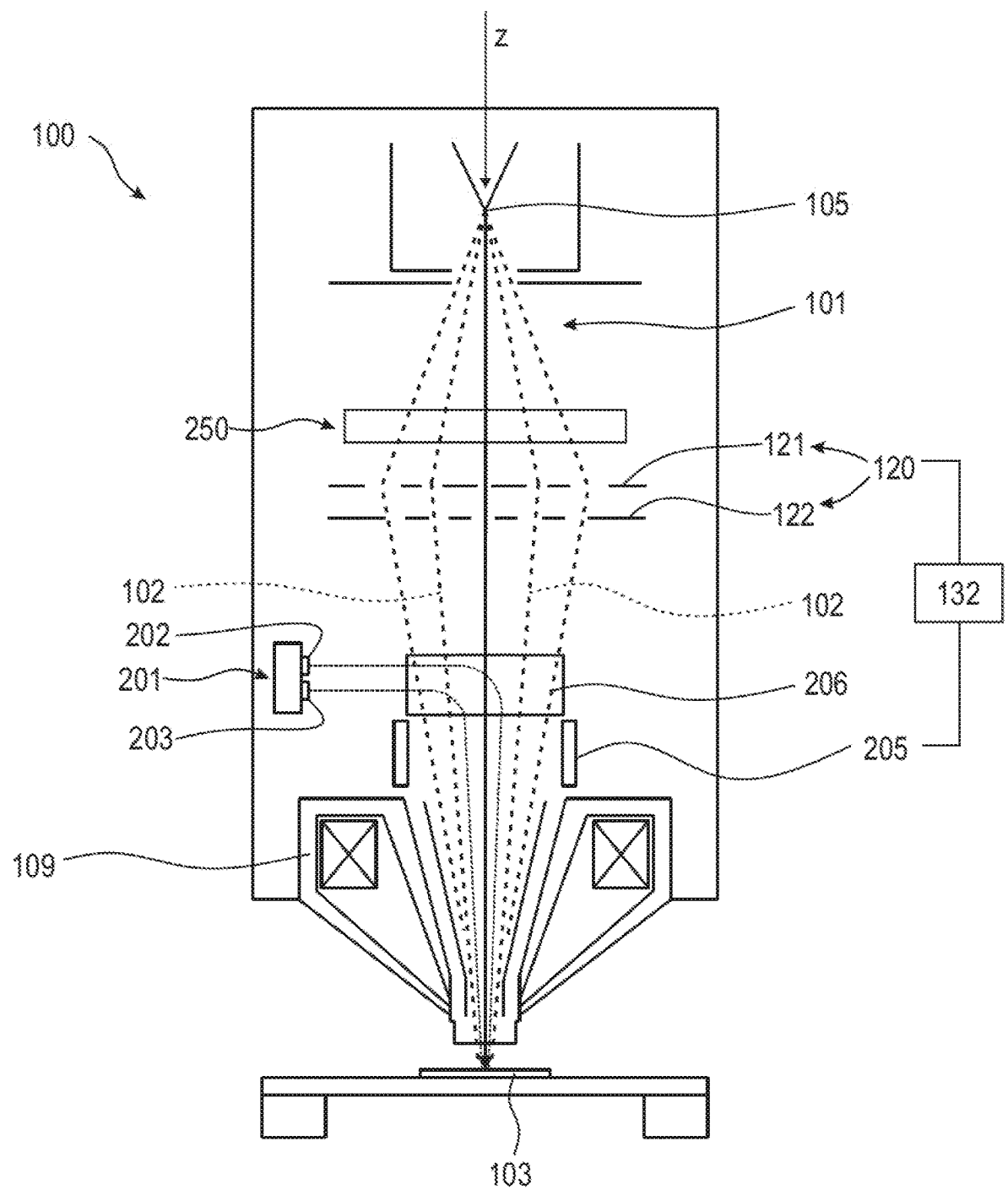
FIG. 2 is a schematic sectional view of a charged particle beam device according to embodiments described herein.

FIG. 2 is a schematic sectional view of a charged particle beam device 100 according to embodiments described herein. The charged particle beam device 100 may be a scanning electron microscope. The charged particle beam device 100 includes a charged particle source 105, e.g. an electron source configured to generate a charged particle beam 101 propagating along the optical axis, z, and a precompensator 120 according to any of the embodiments described herein. The precompensator 120 may be an adjustable precompensator 120, such that an aberration correction provided by the precompensator 120 can be adjusted, such as by providing variable voltage(s) to multiaperture electrode(s) of the precompensator.

The device 100 can include a scanner 205, which may scan the beamlets along the x and/or y direction, perpendicular to the optical axis z. The scanner 205 may operate so as to induce variable aberration in the beamlets 102. The variable aberration may depend on at least one of the phase and magnitude of the scanning, as well as the position (such as with respect to the optical axis, along r, x, and/or y) of the beamlet. The multiaperture electrodes of the precompensator 120 may reduce and/or precompensate the aberrations.

The operation of the precompensator 120 may be in synchronicity with scanning of the beamlets 120 by the scanner 205. The scanner 205 may be controlled by the controller 132 which may also control the precompensator 120. The device 100 can include a controller 132 which can, for example, control the voltages Ur, Uc (see FIG. 1) of each multiaperture electrode 121, 122 of the precompensator 120.

The charged particle beam device 100 can include optics such as a collimation lens, a transfer lens, an objective lens, an electrode, a multipole device, a deflector, and/or a scan deflector.

As is schematically depicted in FIG. 2, the charged particle beam device 100 can include an objective lens 109 which can focus the plurality of beamlets 102 onto a target 103. A plurality of focal points can be formed by focusing each of the beamlets 102.

Optionally, the device 100 includes a detector 201 configured to detect signal particles emitted from the target 103. The detector 201 may include a plurality of detector segments configured to detect the signal particles generated upon impingement of the plurality of beamlets on the target. A first detector segment 202 and a second detector segment 203 are schematically depicted in FIG. 2, wherein the first detector segment 202 is arranged to detect the signal particles generated at a focus of a first beamlet of the plurality of beamlets, and the second detector segment 703 is arranged to detect the signal particles generated by a focus of the second beamlet of the plurality of beamlets. A spatially resolved image can be generated, and/or the inspection speed can be increased by parallel inspection. The detector 201 may be a segmented detector.

The objective lens 109 may include a combined magnetic-electrostatic objective lens including a magnetic lens portion and an electrostatic lens portion. In some embodiments, a retarding field device may be provided which is configured to reduce the landing energy of the charged particles on the target. For example, a retarding field electrode may be arranged upstream of the target.

In an embodiment, in a projection in the x-z plane at the target, each of the beamlets 102 makes an angle with respect to the optical axis, z, and each beamlet 102 is parallel to the x-z plane. In such an embodiment, the precompensator 120 can include at least one "cartesianally variable" multiaperture electrode 122 which is oriented such that variable focusing can occur according to the x-component of the position of each beamlet at the target.

According to embodiments, which may be combined with other embodiments described herein, the charged particle source 105 is an electron source, the charged particle beam is an electron beam, and the charged particle beam device 100 is a scanning electron microscope (SEM). According to other embodiments, the charged particle beam device is an ion beam device, the charged particle source is an ion source, and the charged particle beam is an ion beam.

As seen in FIG. 2, the charged particle beam device may include an electrostatic multipole device 250. In some implementations, the multipole units of the electrostatic multipole device 250 may be selected from the group consisting of electrostatic dipoles, quadrupoles, hexapoles, and octupoles. For example, at least one electrostatic octupole may be provided for each of the plurality of beamlets, such that each beamlet can be individually influenced, e.g. deflected or corrected. In some embodiments, higher order electrostatic multipole elements may be provided, such as multipoles with 12, 14 or 20 poles.

In some embodiments, which may be combined with other embodiments described herein, a multipole device 250 may be provided for influencing the charged particle beam propagating along the optical axis, e.g. downstream or upstream of the precompensator. The multipole device 250 may include an electrostatic corrector having four or more corrector electrodes, particularly eight or more corrector electrodes, more particularly 12 or more corrector electrodes, or even 20 or more corrector electrodes. High order aberrations can be corrected or compensated. The corrector electrodes of the electrostatic corrector may be arranged in a plane essentially perpendicular to the optical axis of the charged particle beam device, e.g. on top of one of the multiaperture electrodes of the precompensator.

In some embodiments, the multipole device 250 may further include an electrostatic deflector with at least two deflector electrodes for deflecting the charged particle beam by a deflection angle. For example, the deflector electrodes may extend over a first length along the optical axis, and/or the corrector electrodes of the electrostatic corrector may extend over a second length along the optical axis smaller than the first length.

Figure 3:
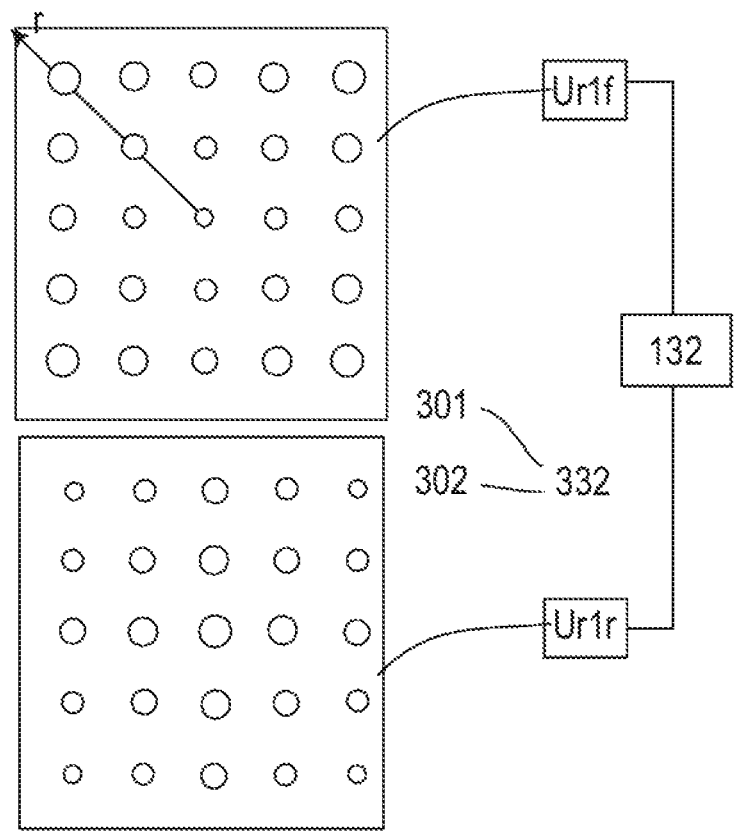
FIG. 3 illustrates "radially variable" multiaperture electrodes, according to an embodiment.

FIG. 3 illustrates, according to an embodiment, "radially variable" multiaperture electrodes of the precompensator. The precompensator can include at least one "radially variable" multiaperture electrode 332, and FIG. 3 illustrates two "radially variable" multiaperture electrodes. The upper "radially variable" multiaperture electrode 301 has apertures which have diameters which increase as the distance r from the optical axis increases, which is referred to herein as a "forward" configuration. The lower "radially variable" multiaperture electrode 302 of FIG. 3 has apertures which have diameters which decrease as the distance r from the optical axis increases, which is referred to herein as a "reverse" configuration.

In an embodiment, each of the at least one "radially variable" multiaperture electrode 332 of the precompensator 120 comprises a plurality of apertures which scale in diameter with an Mth power of the distance, r, of the respective aperture from the optical axis (M being a positive integer). The "radially variable" multiaperture electrode 332 can include a first order "radially variable" multiaperture electrode in which the apertures thereof increase in diameter with the first power of the distance, r. Alternatively/additionally, there can be a second order "radially variable" multiaperture electrode in which the apertures increase in diameter with the second power of the distance, r, from the optical axis. Alternatively/additionally, there can be a third order "radially variable" multiaperture electrode in which the apertures increase in diameter with the third power of the distance, r, from the optical axis; and so on.

The focusing power of each aperture of each "radially variable" multiaperture electrode 332 of the precompensator 120 may vary with aperture diameter. The focusing power applied to a beamlet passing through an aperture of a multiaperture electrode may scale with the aperture size. Moreover, the electric potential, or voltage, of each multiaperture electrode may be controllable/adjustable, such as by the controller 132. The focusing power of each aperture of a "radially variable" multiaperture electrode can scale with the voltage (in some embodiments, conveniently, a respective voltage applied to each respective multiaperture electrode) and the diameter of the aperture. Each aperture's diameter of the multiaperture electrode can, in turn, vary, e.g. according to the $M^{th}$ power of the distance, r, of the aperture from the optical axis, z.

Each multiaperture electrode may be addressed by a controller 132 which can control, independently and/or dynamically, each voltage (e.g. Ur1f, Ur1r) of each multiaperture electrode.

By passing each of the beamlets through a respective aperture of each "radially variable" multiaperture electrode, a radial portion of the aberrations can be reduced. The precompensation of the beamlets can be done by adjustment of each "term" of a polynomial series expansion (of aperture sizes) by the control of the voltage of each of a plurality of "radially variable" multiaperture electrodes; with each "radially variable" multiaperture electrode having a distribution of aperture sizes which scale according to an integer power (M=1, 2, 3, . . . ) of the distance of the aperture, r, from the optical axis.

In an embodiment, each of the at least one "radially variable" multiaperture electrode comprises a respective plurality of apertures which scale in diameter with an $M^{th}$ power of the distance, r, of the respective aperture from the optical axis (M being selected from the set of positive integers).

For convenience, herein, a multiaperture electrode can be a "forward" multiaperture electrode which has apertures which increase along a coordinate such as r, x, or y; or a multiaperture electrode can be a "reverse" multiaperture electrode which has apertures which decrease along a coordinate such as r, x, or y. There are contemplated embodiments in which for each "forward" multiaperture electrode 301 of order M, there is a corresponding "reverse" multiaperture electrode 302 of order M.

The precompensator 120 can include both forward and reverse "radially variable" multiaperture electrodes, which can correspond to the aberration correction being the total of corrections of each "radially variable" multiaperture plate, e.g. the possibly piecewise correction from adjustable terms of the polynomial series (M=1, 2, 3 . . . ), each term coming from a multiaperture electrode which can contribute a positive correction (the forward configuration of the Mth order "radially variable" multiaperture electrode) or negative correction (the reverse configuration of the same Mth order "radially variable" multiaperture electrode).

The precompensator can include each forward "radially variable" multiaperture electrode of order M and lower, for M=2, 3, 4, 5, 6, 7, or 8; and can optionally include each reverse M and lower "radially variable" multiaperture electrode also.

FIG. 3 illustrates, according to an embodiment, a forward "radially variable" multiaperture electrode 301 and a reverse "radially variable" multiaperture electrode 302.

The "radially variable" multiaperture electrode(s) 121 can focus, or optical operate on, each of the plurality of beamlets in a manner that varies with a distance r from the optical axis, z. The optical axis, z can be defined by a central opening of the precompensator 120. In other words, a beamlet propagating close to the optical axis, z can be focused differently (e.g. with a different focal length) than a beamlet propagating distant from the optical axis, z, through each "radially variable" multiaperture electrode 121.

A voltage applied to the upper radially variable multiaperture electrode 301 of FIG. 3 is labeled Ur1f. The labels r1f, of the general notation U for voltage, denote that the voltage is applied to a radially variable multiaperture (r) electrode which is $1^{st}$ order (1) in the scaling of the aperture with distance from the optical axis, and the multiaperture electrode is in a forward configuration (f). The voltage applied to the lower "radially variable" multiaperture electrode 301 of FIG. 3 is labeled Ur1r; the labels r1r denote that the voltage is applied to a radially variable multiaperture (r) electrode which is $1^{st}$ order (1) in the scaling of the aperture with distance from the optical axis, and the multiaperture electrode is in a reverse configuration (r).

By way of explanation, and not limitation, there can be significant aberration due to field curvature in multibeamlet devices, which have beamlets located at positions which vary in distance from the optical axis. The beamlets' aberrations, particularly those from field curvature, may scale, to a significant degree, according to the second power of the distance, r, of the aperture and/or beamlet from the optical axis, z. Field curvature aberration can be known to result in a shift of the focus which may scale as the square of the distance of the beamlet from the optical axis. Beamlets which are far (along the coordinate r) from the optical axis z, may be focused farther along the z direction than those beamlets which are closer to z (at relatively low r). In view of the above, a precompensator 120 which includes, among the "radially variable" multiaperture electrodes, a second order "radially variable" multiaperture electrode, which has apertures which scale with the second power of the distance from the optical axis is particularly contemplated.

Figure 4:
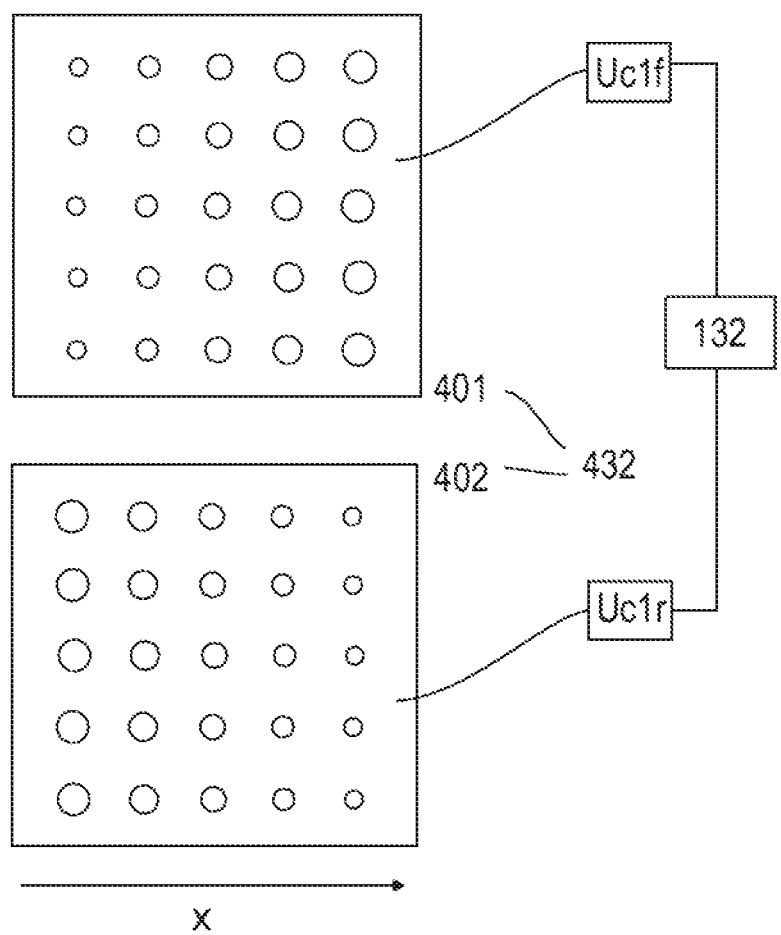
FIG. 4 illustrates "cartesianally variable" multiaperture electrodes, according to an embodiment.

FIG. 4 illustrates, according to an embodiment, "cartesianally variable" multiaperture electrodes 432 of the precompensator 120. The precompensator can include at least one "cartesianally variable" multiaperture electrode 432, and FIG. 4 illustrates two "cartesianally variable" multiaperture electrodes. The upper "cartesianally variable" multiaperture electrode 401 has apertures which have diameters which increase along the coordinate x. The lower "cartesianally variable" multiaperture electrode 402 of FIG. 4 has apertures which have diameters which decrease with the x-component of the position of the aperture. The upper "cartesianally variable" multiaperture electrode 401 can be regarded as a forward multiaperture electrode, and the lower 402, a reverse multiaperture electrode.

Similarly as explained for the "radially variable" multiaperture electrodes of the precompensator, each of the "cartesianally variable" multiaperture electrodes 432 can have a respective plurality of apertures which scale in diameter with an Nth power of the x component of the position of the respective aperture (N being a positive integer).

The precompensator can include each forward "cartesianally variable" multiaperture electrode of order N and lower, for N=2, 3, 4, 5, 6, 7, or 8; and can optionally include each reverse N and lower "cartesianally variable" multiaperture electrode also. Alternatively/additionally, the precompensator 120 can include a similar set of multiaperture electrodes which have the aperture size vary along the y direction.

In an embodiment that can be combined with any other embodiment described herein, the forward "cartesianally variable" multiaperture electrodes of the precompensator includes a first and second order (N=1 and 2) multiaperture electrode.

In an embodiment that can be combined with any other embodiment described herein, the reverse "cartesianally variable" multiaperture electrode(s) include the same order electrodes as in the forward configuration, but are arranged to be decreasing in diameter along x rather than increasing (as are the apertures of the forward multiaperture electrode(s)). In a particular example, there are first and second order forward and reverse "cartesianally variable" multiaperture electrodes.

In an embodiment that can be combined with any other embodiment described herein, the "reverse" multiaperture electrodes of the radially or cartesianally varying type have diameters that scale with an inverse power of the coordinate (r, x, or y as appropriate), e.g. according to 1/M and 1/N. In other words, each reverse "cartesianally variable" multiaperture electrode can have aperture diameters that scale with $x^{-N}$ for positive integers of N; alternatively/additionally, each reverse "radially variable" multiaperture electrode can have aperture diameters that scale with $r^{-M}$ for positive integers of M. The direction or coordinate x may be a direction which the beamlets are scanned by the scanner 205. Alternatively/additionally, the x direction may be that of a rotating coordinate frame such that the x direction at each "cartesianally variable" multiaperture electrode 432 of the precompensator 120 matches the x direction at the scanner 205 and the target 103.

Alternatively/additionally, the precompensator 120 can include at least one "cartesianally variable" multiaperture electrode in which the diameter of each aperture scales with a y component of the position of the aperture. The scanner 205 can deflect the beamlets 102 along the y direction, and the precompensation can include passing the beamlets through the "cartesianally variable" multiaperture electrode(s) with variable apertures which scale with the y component of position, and may operate similarly as described for the "cartesianally variable" multiaperture electrodes 432 described previously which have apertures which vary with x component of position.

The controller 132 can control each respective voltage, e.g. Ux1f, Ux2f, Ux3f . . . (and optionally Ux1r, Ux2r, Ux3r . . . ), of each "cartesianally variable" multiaperture electrode of the precompensator 120 which has apertures which vary along the x direction; and the controller 132 can control each respective voltage, e.g. Uy1f, Uy2f, Uy3f . . . (and optionally Uy1r, Uy2r, Uy3r . . . ), of each "cartesianally variable" multiaperture electrode of the precompensator 120 which has apertures which vary along the y direction.

In an embodiment, the controller 132 is configured to dynamically adjust the respective voltage of each at least one "cartesianally variable" multiaperture electrode in synchronicity with the scanning of each of the beamlets by the scanner. The controller 132 may, alternatively/additionally, adjust the respective voltages of each at least one "cartesianally variable" multiaperture electrode based on an offset of the beamlet(s) by the scanner.

In some embodiments, a beamlet-forming multiaperture plate 110 with a plurality of apertures forms the plurality of beamlets and the beamlet-forming multiaperture plate 110 is arranged upstream of the precompensator 120 (see FIG. 1). In other embodiments, the plurality of beamlets are created by the precompensator 120, e.g. by one of the multiaperture electrodes of the precompensator.

In some embodiments, a beam separator 206 (see FIG. 2) is provided for separating the signal electrons which are emitted from the target 103 from the electrons of the charged particle beam 101 propagating toward the target. The beam separator may for example be a magnetic beam separator or a Wien filter. The device may detect signal charged particles scattered by the target 103. The signal charged particles generated by each of the beamlets 102 may be individually detected via a detector device 201.

The strength of the aberration precompensation, e.g. field curvature correction provided by the precompensator 120 can be adjusted as follows. The precompensator 120 can be connected to a controller 132 configured to adjust at least one voltage Ur of the "radially variable" multiaperture electrode(s) 121 and at least one voltage of the "cartesianally variable" multiaperture electrode(s) 122 (see FIG. 1).

The "cartesianally variable" multiaperture electrode(s) 122 may be arranged upstream or downstream of the "radially variable" multiaperture electrode(s) 121. For example, a distance between the "radially variable" multiaperture electrode(s) 121 and the cartesianally variable multiaperture electrode(s) 122 along the optical axis, z, may be 1 cm or less, or 5 mm or less. In particular, the controller 132 may include variable voltage supplies which connect to each of the multiaperture electrodes of the precompensator 120.

Bearing in mind that there is contemplated a possible series of "radially variable" multiaperture electrodes 121 (such as first, second, third order . . . electrodes with M=1, 2, 3 . . . ), the controller can control the voltage of each electrode of the "radially variable" multiaperture electrode(s) 121 of the series.

Further, bearing in mind that there are also contemplated forward and reverse multiaperture electrodes (possibly for each order M=1, 2, 3 . . . of the multiaperture electrodes), it is possible to have variable control over the precompensation of each beamlet. It can also be advantageous in that each "radially variable" multiaperture electrode 121 can be controlled through adjustment of a respective voltage (Ur1f, Ur2f, Ur3f, Ur1r, Ur2r, Ur3r . . . ).

In an embodiment, the at least one "radially variable" multiaperture electrode 121 can be selected from the group of the forward and reverse configured "series" of M order (M=1, 2, 3 . . . ) of radially variable multiaperture electrodes.

The voltages of electrodes may be set to values that essentially and/or significantly compensate/correct the aberrations such as those caused by optical components of the charged particle beam device. For example aberrations due to field curvature may arise from optical components. Correcting the aberrations can improve resolution of each beamlet.

In some embodiments, the diameters of the apertures of the multiaperture electrodes of the precompensator 120 may span from approximately a few tens of micrometers to a few hundreds of micrometers, such as from 10 micrometers to 200 micrometers.

It is particularly contemplated that the controller 132 can independently adjust and/or control the voltage of each multiaperture electrode of the precompensator 122.

It is noted that, in some embodiments, the multiaperture electrodes of the precompensator have a focusing effect on the plurality of beamlets and generate an actual beam crossover downstream of the precompensator. In other embodiments, a plurality of virtual foci may be provided by the multiaperture electrodes of the precompensator. For example, the plurality of beamlets may have virtual foci upstream or downstream of the target to be inspected.

According to embodiments described herein, a precompensator 120 is provided which allows for control of the amount of aberration correction, such as that due to field curvature. It is possible that the focal length of the central beamlet is essentially kept constant or kept within a certain range, by varying the voltages of the multiaperture electrodes of the precompensator. Also the focal lengths of the radially outer beamlets and/or of any beamlet at a given distance from the optical axis may remain essentially constant.

Each aperture of each multiaperture electrode of the precompensator 120 may be aligned with a respective aperture of each other multiaperture electrode of the precompensator 120. Each beamlet 102 may pass through exactly one aperture of each multiaperture electrode of the precompensator.

The precompensator 120 may also be configurable such that a user can select which multiaperture electrodes are placed in the path of the beamlets. For example, it may be desirable to have the precompensator 120 configured so that the precompensator has an M=2 "radially variable" multiaperture electrode and an N=2 "cartesianally variable" forward multiaperture electrode, and optionally a N=2 "cartesianally variable" reverse multiaperture electrode; another configuration would also add an M=3 "radially variable" multiaperture electrode.

Each multiaperture electrode of the precompensator may be selectable so that each can be placed in the optical path or removed from the optical path and stored for selection in another configuration of the precomensator. Selected multiaperture electrodes can be placed in the optical path (e.g. placed in a slot of the precompensator in the optical path of the beamlets) to operate on the beamlets. For example, each beamlet passes through one respective aperture of each selected multiaperture electrode of the precompensator.

The precompensator may have each, of from 0 order up to M order (M being a positive integer), multiaperture electrodes of the "radially variable" and/or "cartesianally variable" type. The multiaperture electrodes of the precompensator may also include matching pairs of "forward" and "reverse" electrodes of each 0 to M order multiaperture electrode of the "radially variable" and/or "cartesianally variable" types, A 0 order multiaperture electrode has apertures of a constant diameter. The optional entrance and/or exit multiaperture electrodes can be regarded as being 0 order multiaperture electrodes.

In an embodiment that may be combined with any other embodiment described herein, each non-zero order multiaperture electrode of the precompensator may be accompanied, respectively, by at least one zero order multiaperture electrode. For example, each 1, 2, 3, 4 or higher order multiaperture electrode is adjacent to a zero order multiaperture electrode. For example, each first or higher order multiaperture electrode has an accompanying zero order multiaperture electrode directly before it in the optical path and another zero order multiaperture electrode directly following it in the optical path. The zero order multiaperture electrode(s) may aid in reducing aberration such as field curvature.

In an embodiment that may be combined with any other embodiment described herein, the precompensator may include a "macro-lens" and/or "macro-electrode" with one large aperture through which all of the beamlets pass. The macro-electrode may produce a field which extends to, and can be modified/adjusted by, each multiaperture electrode of the precompensator. Alternatively/additionally, the precompensator may include an electrostatic lens which operates on all the beamlets passing through the precompensator; the field produced by the electrostatic lens may extend to, and can be modified/adjusted by, each multiaperture electrode of the precompensator. Alternatively/additionally, the precompensator may include an electromagnetic lens which operates on all the beamlets passing through the precompensator; the field produced by the electromagnetic lens may extend to, and can be modified/adjusted by, each multiaperture electrode of the precompensator. The optional electrostatic and/or electromagnetic lenses may be regarded as a type of "macro-lens." A macro-lens may be positioned near or adjacent the precompensator such that the field of the macro-lens extends to and may be modified/adjusted by the multiaperture electrodes of the precompensator; alternatively/additionally, a macro-lens may be considered as part of the precompensator.

In an embodiment that may be combined with any other embodiment described herein, each of the beamlets pass through one respective aperture of each multiaperture electrode of the precompensator. This may, for example, allow sensitive control of optical operations on the beamlets such as for aberration correction. In other embodiments, there can be multiaperture electrodes which have apertures which pass more than one beamlet each. This may, for example, ease alignment.

In an embodiment that may be combined with any other embodiment described herein, the distance between multiaperture electrodes of the precompensator is nonconstant. The distance can be adjustable. The distance can be determined so as to provide aberration correction and/or to provide flexibility in aberration correction, particularly of field curvature.

In an embodiment, the placement of the apertures is such that there is optical alignment between corresponding apertures of each multiaperture electrode. The optical alignment may be such that each beamlet passes through the center of a respective aperture of each multiaperture electrode. Alternatively/additionally, there may be multiaperture electrodes with slightly offset apertures which may allow for correction of aberration, for example distortions.

Aberrations that may be corrected by the precompensator may include distortions, such as pincushion and/or barrel distortion.

In an embodiment that may be combined with any other embodiment described herein, the multiaperture electrodes of the precompensator may be aligned with the optical axis. In another embodiment that may be combined with other embodiments described herein, the precompensator's multiaperture electrodes are at least nominally aligned with the optical axis, z (e.g. centered on the optical axis z), except for at least one "displaced" multiaperture electrode which is displaced along x and/or y from the optical axis. At least one displaced multiaperture electrode may aid in reducing aberrations, such as distortion.

In another embodiment that may be combined with other embodiments described herein, the precompensator includes at least one "displacement-variable" multiaperture electrode in which an array formed by each aperture of the at least one "displacement-variable" multiaperture electrode is offset from a nominal center, e.g. the optical axis z. Each "displacement-variable" multiaperture electrode can optionally be movable in x, y, and/or z.

Another embodiment of the precompensator 120, which can be combined with any other embodiment described herein, has an M=2 "radially variable" multiaperture electrode and an N=1 "cartesianally variable" forward multiaperture electrode, and optionally a N=1 "cartesianally variable" reverse multiaperture electrode.

The aberrations induced into the beamlets 102 may depend on the amount of deflection, particularly by the scanner 205. The beamlets 102 may be dynamically deflected and/or offset by the scanner 205. The controller 132 may dynamically and/or statically set and/or adjust the respective voltage of any (or each) of the "cartesianally variable" multiaperture electrodes 122, which may be in synchronicity with scanning each of the beamlets. Alternatively/additionally, the controller 132 may dynamically adjust the respective voltages of any (or each) of the multiaperture electrodes 121, 122 of the precompensator 120. Alternatively/additionally, the controller 132 may dynamically adjust the respective voltage of any (or each) of the "radially variable" multiaperture electrodes 121, which may be in synchronicity with scanning each of the beamlets. Alternatively/additionally, the controller 132 may set the respective voltage of any (or each) of the "cartesianally variable" multiaperture electrode(s) according to a magnitude of the deflecting of each of the beamlets by the scanner 205. Alternatively/additionally, the controller 132 may set the respective voltages of any (or each) of the multiaperture electrode(s) according to an offset (which may include a deflection direction and magnitude) of each of the beamlets by the scanner 205.

The precompensator 120 may include a set of "radially variable" multiaperture electrodes 121 (a set being at least one). The precompensation on the beamlets can include passing each of the beamlets through the "radially variable" multiaperture electrode(s) 121 and reducing a radial portion of the aberrations. The precompensator 120 may include a set of "cartesianally variable" multiaperture electrodes 122. The precompensation can include passing each of the beamlets through the "cartesianally variable" multiaperture electrode(s) 122 and reducing a cartesian portion of the aberrations.

It is convenient to consider the possible aberrations to the beamlets which can be precompensated as being decomposable into a radial contribution and a cartesian contribution. The precompensator as described herein exploits such a possible decomposition. Furthermore, it is convenient to regard that each of the radial and cartesian parts of the aberrations can be further decomposed into contributions of varying order (M=1, 2, 3 . . . and N=1, 2, 3 . . . for the radial and cartesian portions, respectively).

In an embodiment, reduction of the radial portion of the aberrations includes passing each beamlet through each corresponding aperture of each of the "radially variable" multiaperture electrodes of the precompensator 120. The voltages of each "radially variable" multiaperture electrode is controlled by the controller 132.

In an embodiment, reduction of the cartesian portion (x and/or y) of the aberrations includes passing each beamlet through each corresponding aperture of each of the "cartesianally variable" multiaperture electrodes.

The precompensator can optionally include an entrance multiaperture electrode and/or an exit multiaperture electrode. The "radially variable" multiaperture electrode(s) and the at least one "cartesianally variable" multiaperture electrode(s) may be between the entrance and exit multiaperture electrodes. The beamlets which pass through the precompensator may each first pass through the entrance multiaperture electrode and finally pass through the exit multiaperture electrode. Precompensating each of the beamlets can include passing each of the beamlets sequentially through the entrance and exit electrodes, and passing each of the beamlets through the "radially variable" multiaperture electrode(s) and the "cartesianally variable" multiaperture electrode(s) after passing each of the beamlets through the entrance multiaperture electrode and before the exit multiaperture electrode. The entrance multiaperture electrode and/or exit multiaperture electrode can each have a plurality of apertures of the same respective diameters (e.g. the apertures of the entrance multiaperture electrode are $d_1$, and the apertures of the exit multiaperture electrode are $d_2$).

FIG. 5 is a schematic sectional view of a precompensator 120 according to embodiments described herein. The precompensator 120 of FIG. 5 may have some or all of the features of the precompensator of FIG. 1, such that reference can be made to the above explanations, which are not repeated here.

The precompensator 120 of FIG. 5 includes a "radially variable" multiaperture electrode 121 with a first plurality of openings providing a varying focal length for a plurality of beamlets, a "cartesianally variable" multiaperture electrode 122 with a second plurality of openings aligned with the first plurality of openings, and a controller 132 configured to adjust at least one of the voltages Ur and Uc of the radially variable and cartesianally variable multiaperture electrodes 121, 122.

In some embodiments, which may be combined with other embodiments described herein, the precompensator 120 may further include an exit multiaperture electrode 123 with a third plurality of openings downstream of the radial and cartesianally variable multiaperture electrodes 121 and 122. Alternatively or additionally, the precompensator 120 may further include an entrance multiaperture electrode 124 with a fourth plurality of openings upstream of radial and cartesianally variable multiaperture electrodes 121 and 122.

The entrance and exit multiaperture electrodes may have apertures of a constant diameter with respect to the coordinates r, x, and/or y. In some embodiments, the entrance and/or exit multiaperture electrodes 123, 124 may be grounded, as is schematically depicted in FIG. 5. In particular, in some implementations, a grounded entrance multiaperture electrode 124 may be arranged upstream of the "radially variable" multiaperture electrode 121, and a grounded exit multiaperture electrode 123 may be arranged downstream of the "cartesianally variable" multiaperture electrode 122.

When the entrance multiaperture electrode 124 and the exit multiaperture electrode 123 are grounded, the precompensator 120 can have substantially and/or essentially the effect of an array of einzel lenses which focus the plurality of beamlets without changing the energy of the beamlets. Accordingly, the charged particles exiting the precompensator 120 can have essentially and/or substantially the same energy as the charged particles entering the precompensator 120.

An einzel lens may conventionally consist of three or more electrodes with cylindrical openings in series along the optical axis. The electrostatic potential in an einzel lens is symmetric such that the charged particles regain the initial energy upon exiting the einzel lens. In particular, the entrance and exit electrodes an einzel lens may be grounded or may be provided on the same potential. In an einzel lens, the radial velocity of the radially outer charged particles can be altered by at least one central electrode such that the outer charged particles converge toward the optical axis.

In an embodiment, the electrostatic multipole device 250 can be provided at a beam entrance surface of the precompensator 120 directed in an upstream direction. For example, the multipole units of the electrostatic multipole device 250 may be integrally formed at a surface of the entrance multiaperture electrode 124, directed toward the charged particle source. Alternatively or additionally, the multipole units of the electrostatic multipole device 250 may be provided at a beam exit surface of the precompensator 120 directed in a downstream direction. For example, the multipole units may be integrally formed at a surface of the exit multiaperture electrode 123 directed toward the target.

FIG. 6 illustrates a method of operating a charged particle device, according to embodiments described herein. The method includes forming beamlets 610, passing each beamlet through at least one "radially variable" multiaperture electrode 620, passing each beamlet through at least one "cartesianally variable" multiaperture electrode 630, scanning each of the beamlets 640, and focusing each beamlet on a target 650.

FIG. 7 illustrates, according to an embodiment, multiaperture electrodes of the precompensator. The precompensator can include at least one multiaperture electrode 732 with elliptical apertures having unequal major and minor axes. FIG. 7 illustrates two "elliptical" multiaperture electrodes. The upper "elliptical" multiaperture electrode 701 has apertures which have major axes along x, and the lower "elliptical" multiaperture electrode 702 of FIG. 7 has apertures has apertures which have major axes along y. Each beamlet may pass through one respective aperture of each "elliptical" multiaperture electrode. The controller 132 may communicate to each "elliptical" multiaperture electrode and apply a variable voltage Uex, Uey thereto. Elliptical apertures may allow for stigmatism to be variably adjusted.

As is understood from the preceding description, the precompensator can include a series of multiaperture electrodes that mimic terms of a polynomial series. For example, each term of equation 1 can represent each "radially variable" multiaperture electrode of 0, 1, 2 . . . and M order. In series 1 below, each term represents a multiaperture electrode having a distribution of aperture sizes given by each respective term. The aperture diameters of each respective scale according to the power of r ("radially variable" multiaperture electrodes). In series 2, the aperture diameters scale according to a power of x ("cartesianally variable" multiaperture electrodes). A series analogous to Series 2 in which x is replaced by y can be representative of "cartesianally variable" multiaperture electrodes with diameters that scale along y rather than x.

$$\Sigma_{k=0}^{M} a_k r^M = a_0 r^0 + a_1 r^1 + a_2 r^2 + a_3 r^3 + a_4 r^4 \qquad \text{(Series 1)}$$

$$\Sigma_{k=0}^{N} a_k x^N = a_0 x^0 + a_1 x^1 + a_2 x^2 + a_3 x^3 + a_4 x^4 \qquad \text{(Series 2)}$$

Analogously, according to an embodiment that may be combined with any other embodiment, the precompensator can include multiaperture electrodes of variable ellipticity. In each "elliptically variable" multiaperture electrode, the ratio, Q, of the major/minor axis of the apertures scales along r, x, or y. Referring again to Series 1 and Series 2, each term thereof may correspond to the variable ratio Q (the ratio of major and minor axes) rather than to the variable aperture diameter. The precompensator may include any "elliptically variable" multiaperture electrode inferred from Series 1 and Series 2, and combinations thereof.

In embodiments that may be combined with any other embodiment described herein, the placement of the apertures of a multiaperture electrode varies along x, y, or r. For example, the apertures are not aligned so that each beamlet is centered in the aperture. The aperture misalignment (in the x, y, or radial directions, respectively), with respect to a beamlet-centered position, of each aperture of a multiaperture electrode scales according to a term of Series 1 or Series 2. Such an arrangement may be useful in providing flexible correction of coma, for example.

Each configuration and/or type of multiaperture electrode described herein may be optionally in the precompensator. While the foregoing is directed to specific embodiments, other and further embodiments may be devised without departing from the basic scope thereof, and the scope thereof is determined by the claims that follow.

The invention claimed is:

1. A method of operating a charged particle beam device, comprising:
forming a beam of charged particles;
forming a plurality of beamlets from the beam of charged particles, the beamlets centered on an optical axis, z, of the charged particle beam device, such that a majority of the plurality of the beamlets, after passing a beamlet-forming multiaperture plate, are shifted from the optical axis;
precompensating each of the beamlets by passing each beamlet through a precompensator which reduces aberrations of the beamlets at a target, the precompensator comprising a plurality of multiaperture electrodes, including
at least one "radially variable" multiaperture electrode in which the diameter of each aperture thereof scales with the distance of the aperture from the optical axis, z; and
at least one "cartesianally variable" multiaperture electrode in which the diameter of each aperture thereof scales with an x component of the position of the aperture, x being perpendicular to z;
scanning each of the beamlets along a direction perpendicular to z; and
focusing each of the beamlets with an objective lens onto the target to form a plurality of focal points.

2. The method of claim 1, wherein
the precompensating comprises
passing each of the beamlets through the at least one "radially variable multiaperture electrode and reducing a radial portion of the aberrations, and
passing each of the beamlets through the at least one "cartesianally variable" multiaperture electrode and reducing a cartesian portion of the aberrations.

3. The method of claim 2, wherein
the at least one "radially variable" multiaperture electrode is centered on the optical axis; and
reducing the radial portion of the aberrations includes
passing each beamlet through each corresponding aperture of each of the at least one radially variable multiaperture electrodes; and wherein
the at least one "cartesianally variable" multiaperture electrode is centered on the optical axis; and
reducing the cartesian portion of the aberrations includes
passing each beamlet through each corresponding aperture of each of the at least one "cartesianally variable" multiaperture electrode.

4. The method of claim 1, wherein,
at the target, a projection of each of the beamlets makes an angle with respect to the optical axis, z, in the x-z plane; and
each beamlet is parallel to the x-z plane.

5. The method of claim 1, wherein
each of the at least one "radially variable" multiaperture electrode comprises a respective plurality of apertures which scale in diameter with an $M^{th}$ power of the distance of the respective aperture from the optical axis; and wherein, for each of the at least one "radially variable" multiaperture electrode, M is selected from the set of positive integers.

6. The method of claim 5, wherein
each of the at least one "cartesianally variable" multiaperture electrode comprises
   a respective plurality of apertures which scale in diameter with an $N^{th}$ power of the x component of the position of the respective aperture; and wherein,
for each of the at least one "cartesianally variable" multiaperture electrode, N is selected from the set of positive integers.

7. The method of claim 6, wherein
the at least one "cartesianally variable" multiaperture electrode comprises at least one "forward" multiaperture electrode, wherein
   the diameters of the apertures of each "forward" multiaperture electrode increase with the x-component of the position of the aperture, and
for each "forward" multiaperture electrode,
   the at least one "cartesianally variable" multiaperture electrode further comprises a "reverse" multiaperture electrode, wherein
      the diameters of the apertures of each "reverse" multiaperture electrode decrease with the x-component of the position of the aperture.

8. The method of claim 6, wherein
the at least one "radially variable" multiaperture electrode comprises
   an M=2 "radially variable" multiaperture electrode which is a second-order "radially variable" multiaperture electrode which comprises a plurality of apertures which scale in diameter with the $2^{nd}$ power of the distance of the aperture from the optical axis; and
the at least one "cartesianally variable" multiaperture electrode comprises
   an N=2 "cartesianally variable" forward multiaperture electrode which is a second-order "cartesianally variable" multiaperture electrode which comprises a plurality of apertures which scale in diameter with the $2^{nd}$ power of the x component of the position of the aperture.

9. The method of claim 8, wherein
the at least one "cartesianally variable" multiaperture electrode further comprises
   an N=2 "cartesianally variable" reversed multiaperture electrode which comprises a plurality of apertures which decrease in diameter with the $2^{nd}$ power of the x component of the position of the aperture.

10. The method of claim 1, further comprising:
setting a respective voltage, of a plurality of voltages, on each multiaperture electrode of the plurality of multiaperture electrodes.

11. The method of claim 10, further comprising:
dynamically adjusting the respective voltage of each of the at least one "cartesianally variable" multiaperture electrode, wherein
the dynamically adjusting is in synchronicity with scanning each of the beamlets.

12. The method of claim 11, further comprising:
dynamically adjusting the respective voltage of each of the at least one "radially variable" multiaperture electrodes, wherein
the dynamically adjusting is in synchronicity with scanning each of the beamlets.

13. The method of claim 11, comprising:
setting the respective voltage to the at least one "cartesianally variable" multiaperture electrode according to a magnitude of a deflecting of each of the beamlets by a scanner.

14. The method of claim 1, wherein
precompensating each of the beamlets further comprises
   passing each of the beamlets sequentially through an entrance multiaperture electrode and an exit multiaperture electrode, and
   passing each of the beamlets through the at least one "radially variable" multiaperture and the at least one "cartesianally variable" multiaperture electrode after passing each of the beamlets through the entrance multiaperture electrode and before the exit multiaperture electrode.

15. The method of claim 1, further comprising
deflecting each of the beamlets along a direction y, wherein
y is perpendicular to x and z; and wherein
the precompensating further comprises
   at least one orthogonal "cartesianally variable" multiaperture electrode in which the diameter of each aperture thereof scales with a y component of the position of the aperture.

16. The method of claim 1, further comprising
detecting signal charged particles scattered by the target, wherein the signal charged particles generated by each of the beamlets are individually detected via a detector device.

17. A charged particle beam device, comprising:
a charged particle source and a beamlet-forming multiaperture plate centered on an optical axis, z, the beamlet-forming multiaperture plate including a plurality of apertures, each aperture for passing a beamlet, the beamlet-forming multiaperture plate forming a plurality of beamlets of charged particles;
a precompensator for reducing aberrations of the beamlets at a target;
a scanner for scanning each of the beamlets;
an objective lens for focusing each beamlet onto the target; and
a controller configured to communicate with the precompensator and the scanner; wherein
the precompensator includes:
   at least one "radially variable" multiaperture electrode in which the diameter of each aperture thereof scales with the distance of the aperture from the optical axis, z; and
   at least one "cartesianally variable" multiaperture electrode in which the diameter of each aperture thereof scales with an x component of the position of the aperture, x being perpendicular to z.

18. The charged particle beam device of claim 17, wherein
the controller is configured to control each voltage of a plurality of voltages of the at least one "cartesianally variable" multiaperture electrode; and
the controller is configured to control each voltage of a plurality of voltages of the at least one "radially variable" multiaperture electrode.

19. The charged particle beam device of claim 18, wherein:
each of the at least one "radially variable" multiaperture electrode comprises a respective plurality of apertures which scale in diameter with an $M^{th}$ power of the distance of the respective aperture from the optical axis; wherein, for each of the at least one "radially variable" multiaperture electrode, M is selected from the set of positive integers; and wherein:

each of the at least one "cartesianally variable" multiaperture electrode comprises:

a respective plurality of apertures which scale in diameter with an $N^{th}$ power of the x component of the position of the respective aperture; and wherein, for each of the at least one "cartesianally variable" multiaperture electrodes, N is selected from the set of positive integers; wherein the at least one "radially variable" multiaperture electrode comprises an M=2 "radially variable" multiaperture electrode which is a second-order "radially variable" multiaperture electrode which comprises a plurality of apertures which scale in diameter with the $2^{nd}$ power of the distance of the aperture from the optical axis; and the at least one "cartesianally variable" multiaperture electrode comprises an N=2 "cartesianally variable" forward multiaperture electrode which is a second-order "cartesianally variable" multiaperture electrode which comprises a plurality of apertures which increase in diameter with the $2^{nd}$ power of the x component of the position of the aperture; and wherein the controller is configured to dynamically adjust the respective voltage of each at least one "cartesianally variable" multiaperture electrode.

20. A precompensator for a charged particle device, comprising at least one "radially variable" multiaperture electrode in which the diameter of each aperture thereof scales with the distance of the aperture from the optical axis, z; and at least one "cartesianally variable" multiaperture electrode in which the diameter of each aperture thereof scales with an x component of the position of the aperture, x being perpendicular to z.

21. A precompensator for a charged particle device, comprising at least one "elliptically variable" multiaperture electrode in which the ratio of major/minor axes of each aperture thereof scales with the distance of the aperture from the optical axis, z, of the precompensator along a radial direction r, or with an x component of the position of the aperture, x being perpendicular to z.

22. A precompensator for a charged particle device, comprising at least one "offset-variable" multiaperture electrode in which the center of each aperture of the at least one "offset-variable" multiaperture electrode is variably offset from being configured to pass a beamlet through the center of the aperture, the amount of offset scaling with the distance of the aperture from the optical axis, z, of the precompensator along a radial direction r, or with an x component of the position of the aperture, x being perpendicular to z.

* * * * *